(12) United States Patent
Hwang

(10) Patent No.: US 6,946,381 B2
(45) Date of Patent: Sep. 20, 2005

(54) METHOD OF FORMING INSULATING FILM IN SEMICONDUCTOR DEVICE

(75) Inventor: Sung Bo Hwang, Daejeon-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/731,487

(22) Filed: Dec. 10, 2003

(65) Prior Publication Data

US 2005/0014389 A1 Jan. 20, 2005

(30) Foreign Application Priority Data

Jul. 18, 2003 (KR) .................................. 10-2003-0049466

(51) Int. Cl.[7] .......................................... H01L 21/4763
(52) U.S. Cl. ........................ 438/618; 438/622; 438/623; 438/638; 438/780; 438/781
(58) Field of Search ................................ 438/618, 622, 438/637–640, 669, 672, 780, 781, 623

(56) References Cited

U.S. PATENT DOCUMENTS

| | | | |
|---|---|---|---|
| 6,107,357 A | * | 8/2000 | Hawker et al. ............... 521/77 |
| 6,171,945 B1 | | 1/2001 | Mandal et al. |
| 6,309,957 B1 | | 10/2001 | Tu et al. |
| 6,326,302 B1 | * | 12/2001 | Joubert et al. .............. 438/638 |
| 6,365,506 B1 | | 4/2002 | Chang et al. |
| 6,420,441 B1 | * | 7/2002 | Allen et al. .................. 521/77 |
| 6,525,428 B1 | | 2/2003 | Ngo et al. |
| 6,541,367 B1 | | 4/2003 | Mandal et al. |
| 6,630,520 B1 | * | 10/2003 | Bruza et al. ................. 521/77 |

FOREIGN PATENT DOCUMENTS

KR      1020020001144      2/1998

* cited by examiner

*Primary Examiner*—Mary Wilczewski
*Assistant Examiner*—Toniae M. Thomas
(74) *Attorney, Agent, or Firm*—Mayer, Brown, Rowe & Maw LLP

(57) ABSTRACT

The present invention relates to a method of forming an insulating film in a semiconductor device. The method includes forming a low dielectric constant insulating film containing a foaming agent on a semiconductor substrate, forming a contact hole or a trench in a low dielectric constant insulating film by means of a dual damascene process, and then making the low dielectric constant insulating film containing the foaming agent a porous low dielectric constant insulating film. It is therefore possible to prevent chemicals used in a dual damascene process from remaining in pores of the porous low dielectric constant insulating film. Consequently, the present invention has advantages that it can prevent metal wirings formed in a contact hole or a trench from being eroded and enhance reliability of the process and electrical properties of the device.

10 Claims, 1 Drawing Sheet

METHOD OF FORMING INSULATING FILM IN SEMICONDUCTOR DEVICE

BACKGROUND

1. Field of the Invention

The present invention relates to a method of forming an insulating film in a semiconductor device and, more specifically, to a method of forming an insulating film in a semiconductor device by which an insulating film is made to be a porous low dielectric constant insulating film.

2. Discussion of Related Art

An insulating film is formed between metal wirings to electrically isolate neighboring metal wirings. In this case, the structure of the metal wiring/the insulating film/the metal wiring is similar to the structure of the top electrode/the dielectric film/the bottom electrode of the capacitor, a parasitic capacitor is formed. For this reason, there is a problem that the operating speed of the device is lowered due to RC delay generated by resistive components and parasitic capacitance of the metal wiring. In addition, as an electrical signal transferred through the metal wiring is affected, reliability of the device is lowered.

For this reason, in order to overcome the above problems, the insulating film formed between the metal wirings is made to be a low dielectric constant insulating film having a low dielectric constant. In this case, however, the distance between the wirings becomes narrow due to an increased level of integration. Therefore, there are limitations to preventing the parasitic capacitor for being formed by means of a method of lowering a total dielectric constant by forming an insulating film using a material of a low dielectric constant.

In recent years, in order to overcome this problem, a porous low dielectric constant insulating film in which air having the lowest dielectric constant is contained is formed. In the course of forming a contact hole (or a via hole) or a trench in the porous low dielectric constant insulating film through a dual damascene process, chemicals used to etch the insulating film are introduced into pores of the porous low dielectric constant insulating film and remain therein.

As such, if the chemicals remain in the pores, metal wirings formed in a subsequent process are eroded by the chemicals. This may cause fail of the device, etc. Accordingly, it is required to form a dense film on the surface of the porous low dielectric constant insulating film. For this reason, the process steps become complicated and the process time is lengthened.

SUMMARY OF THE INVENTION

The present invention is directed to provide a method of forming an insulating film in a semiconductor device capable of preventing metal wirings formed in a contact hole or a trench from being eroded and enhancing reliability of the process and electrical properties of the device, by preventing chemicals used in a dual damascene process from remaining in pores of a porous low dielectric constant insulating film, in such a way that a low dielectric constant insulating film containing a foaming agent is formed on a semiconductor substrate, a contact hole or a trench is formed in a low dielectric constant insulating film by means of a dual damascene process and the low dielectric constant insulating film containing the foaming agent is then made to be the porous low dielectric constant insulating film According to a preferred embodiment of the present invention, there is provided a method of forming an insulating film in a semiconductor device, including the steps of forming a low dielectric constant insulating film containing a foaming agent on a semiconductor substrate in which various elements for forming the semiconductor device are formed, forming a dual damascene pattern in the low dielectric constant insulating film, and performing an annealing process so that the foaming agent reacts to form pores, thus making the low dielectric constant insulating film a porous low dielectric constant insulating film.

In the aforementioned of a method of forming an insulating film in a semiconductor device according to another embodiment of the present invention, poly methyl metacrylate (PMMA) copolymer, and high polymer having aliphatic or aromatic core may be used as the foaming agent.

In the aforementioned of a method of forming an insulating film in a semiconductor device according to another embodiment of the present invention, methyl silsesquioxane (MSSQ) may be used as a matrix of the low dielectric constant insulating film.

In the aforementioned of a method of forming an insulating film in a semiconductor device according to another embodiment of the present invention, the process of forming the dual damascene pattern is performed at a temperature at which the foaming agent does not react depending on the type of the foaming agent.

In the above, it is preferred that the process of forming the dual damascene pattern is performed −50° C. to at room temperature.

In the aforementioned of a method of forming an insulating film in a semiconductor device according to another embodiment of the present invention, the annealing process is performed at a temperature at which the foaming agent can sufficiently react depending on the type of the foaming agent. At this time, the annealing process may be performed at a temperature of 200° C. to 500° C.

DETAILED DESCRIPTION OF PREFERRED EMBODIMENTS

Figure 1A:
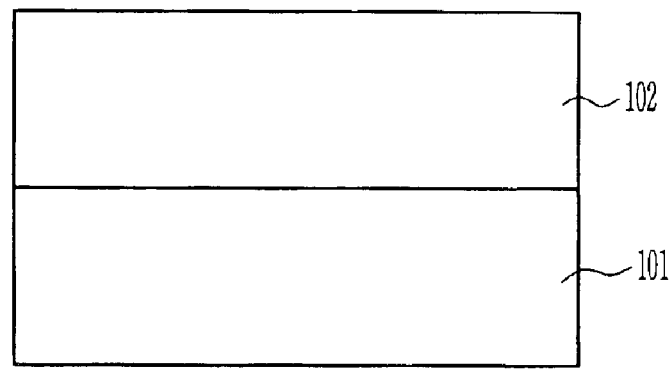
FIGS. 1A to 1C are cross-sectional views for explaining a method of forming an insulating film in a semiconductor device according to a preferred embodiment of the present invention.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in case where it is described that one film is "on" the other film or a semiconductor substrate, the one film may directly contact the other film or the semiconductor substrate. A third film may be intervened between the one film and the other film or the semiconductor substrate. Further, in the drawing, the thickness and size of each layer are exaggerated for convenience of explanation and clarity. Like reference numerals are used to identify the same or similar parts.

Figure 1B:
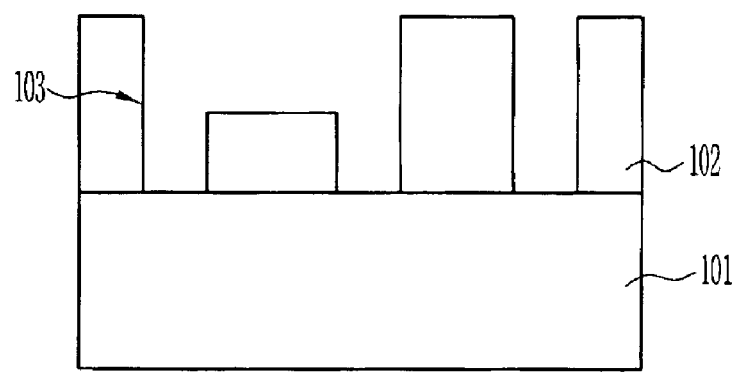
Figure 1C:
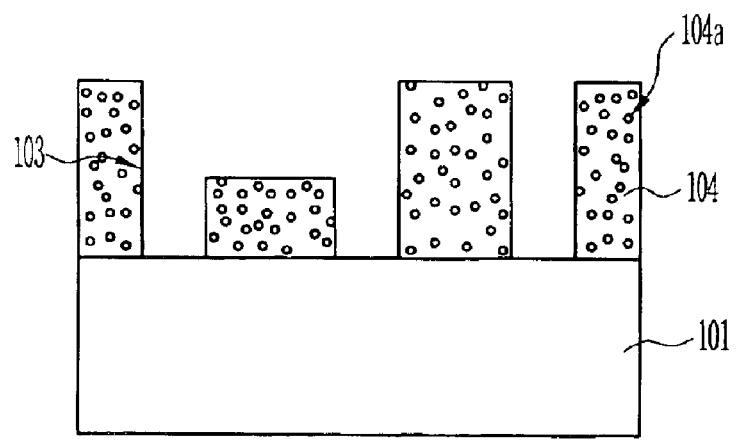

FIGS. 1A to 1C are cross-sectional views for explaining a method of forming an insulating film in a semiconductor device according to a preferred embodiment of the present invention.

Referring to FIG. 1A a low dielectric constant insulating film 102 containing a foaming agent is formed on the entire structure of a semiconductor substrate 101 in which various elements for forming a semiconductor device such as transistors, flash memory cells or metal wirings are formed. In this case, the low dielectric constant insulating film 102 is preferably formed in track equipments.

The foaming agent is a material for forming pores within a thin film.

In the above, in case where the low dielectric constant insulating film is covered in a spin-on-dielectric (SOD) scheme, a foaming agent of polymer is blended and is degraded in a subsequent annealing process, so that the agent is volatilized. The foaming agent may include a material that is thermally unstable and is thus degraded about 400° C. to volatilize. More particularly, for example, methyl silsesquioxane (MSSQ) may be used as a matrix of the low dielectric constant insulating film. The foaming agent may include poly methyl metacrylate (PMMA) copolymer, high polymer having aliphatic or aromatic core, and the like.

Meanwhile, in the event that the porous low dielectric constant insulating film 102 is deposited by means of plasma enhanced chemical vapor deposition (PECVD) method, a precursor having a CHx radical can be used as the foaming agent. In this case, CH fragments contained within the thin film upon deposition is volatilized to form pores. More particularly, for example, a vinyl radical may be used as the foaming agent.

With reference to FIG. 1B, a dual damascene pattern 103 having contact holes or trenches is formed in the low dielectric constant insulating film 102 by means of a dual damascene process. Thereby, a junction (not shown) formed at the bottom of the low dielectric constant insulating film 102 is exposed through the dual damascene pattern 103. At this time, the dual damascene process is performed before the pores are formed in the low dielectric constant insulating film 102, chemicals used in the dual damascene process do not remain within the low dielectric constant insulating film 102 and are completely removed, after the dual damascene process is completed.

In the above, if the dual damascene process is effected at high temperature, the foaming agent contained in the low dielectric constant insulating film 102 may react to cause the pores within the low dielectric constant insulating film 102. Accordingly, it is preferred that the dual damascene process is performed at room temperature or at low temperature (for example, −50° C.) at which the foaming agent will not react depending on the type of the foaming agent.

By reference to FIG. 1C, an annealing process is carried out so that the foaming agent contained within the low dielectric constant insulating film 102 reacts, so that the low dielectric constant insulating film 102 is made to be a porous low dielectric constant insulating film 102 having a large number of pores 104a. In the case, the annealing process is performed at a temperature at which the foaming agent can sufficiently react depending on the type of the foaming agent. It is preferred that the annealing process is performed at a high temperature of 200° C. to 500° C.

The dual damascene pattern 103 is thus formed in the porous low dielectric constant insulating film 104 having the lowest dielectric constant by means of the dual damascene process while preventing the chemicals from remaining the pores.

According to the present invention described above, a low dielectric constant insulating film containing a foaming agent is formed on a semiconductor substrate. A contact hole or a trench is formed in a low dielectric constant insulating film by means of a dual damascene process. The low dielectric constant insulating film containing the foaming agent is then made to be a porous low dielectric constant insulating film. It is therefore possible to prevent chemicals used in a dual damascene process from remaining in pores of the porous low dielectric constant insulating film. Consequently, the present invention has advantages that it can prevent metal wirings formed in a contact hole or a trench from being eroded and enhance reliability of the process and electrical properties of the device.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming an insulating film in a semiconductor device, comprising the steps of:

forming a low dielectric constant insulating film containing a foaming agent on a semiconductor substrate in which various elements for forming the semiconductor device are formed;

forming a dual damascene pattern in the low dielectric constant insulating film; and performing an annealing process so that the foaming agent reacts with the low dielectric constant insulating film to form pores therein, thus making the low dielectric constant insulating film a porous low dielectric constant insulating film, wherein the pores are formed after the damascene pattern is formed so that it is possible to prevent chemicals used in the step of forming the dual damascene pattern from remaining in the pores of the porous low dielectric constant insulating film.

2. The method as claimed in claim 1, wherein poly methyl metacrylate (PMMA) copolymer, and high polymer having aliphatic or aromatic core are used as the foaming agent.

3. The method as claimed in claim 1, wherein methyl silsesquioxane (MSSQ) is used as a matrix of the low dielectric constant insulating film.

4. The method as claimed in claim 1, wherein the process of forming the dual damascene pattern is performed at a temperature of −50° C. to room temperature.

5. The method as claimed in claim 1, wherein the annealing process is performed at a temperature in the range of 200° C. to 500° C.

6. A method of forming an insulating film in a semiconductor device, comprising the steps of:

forming a low dielectric constant insulating film containing a foaming agent on a semiconductor substrate in which various elements for forming the semiconductor device are formed;

forming a dual damascene pattern in the low dielectric constant insulating film; and subsequently performing an annealing process so that the foaming agent reacts with the low dielectric constant insulating film to form pores therein, thus making the low dielectric constant insulating film a porous low dielectric constant insulating film.

7. The method as claimed in claim 6, wherein polypoly methyl metacrylate (PMMA) copolymer, and high polymer having aliphatic or aromatic core are used as the foaming agent.

8. The method as claimed in claim 6, wherein methyl silsesquioxane (MSSQ) is used as a matrix of the low dielectric constant insulating film.

9. The method as claimed in claim 6, wherein the process of forming the dual damascene pattern is performed at a temperature of −50° C. to room temperature.

10. The method as claimed in claim 6, wherein the annealing process is performed at a temperature in the range of 200° C. to 500° C.

* * * * *